United States Patent
Mondi et al.

(10) Patent No.: US 7,755,173 B2
(45) Date of Patent: Jul. 13, 2010

(54) SERIES-SHUNT SWITCH WITH THERMAL TERMINAL

(75) Inventors: Anthony Paul Mondi, Wilmington, MA (US); Joseph Gerard Bukowski, Merrimack, NH (US)

(73) Assignee: M/A-COM Technology Solutions Holdings, Inc., Lowell, MA (US)

(*) Notice: Subject to any disclaimer, the term of this patent is extended or adjusted under 35 U.S.C. 154(b) by 189 days.

(21) Appl. No.: 11/823,228

(22) Filed: Jun. 26, 2007

(Under 37 CFR 1.47)

(65) Prior Publication Data

US 2009/0001527 A1    Jan. 1, 2009

(51) Int. Cl.
*H01L 29/06* (2006.01)

(52) U.S. Cl. .............................. 257/656; 257/E29.336; 438/605

(58) Field of Classification Search .......... 257/E29.336, 257/656; 438/605
See application file for complete search history.

(56) References Cited

U.S. PATENT DOCUMENTS

| 4,807,022 | A  | * | 2/1989  | Kazior et al. ............... 257/713 |
| 4,905,071 | A  | * | 2/1990  | Chalifour et al. ............ 257/506 |
| 6,552,626 | B2 |   | 4/2003  | Sharpe et al. |
| 6,644,849 | B1 | * | 11/2003 | Conner ....................... 374/141 |
| 6,834,937 | B2 | * | 12/2004 | Killmeier et al. .............. 347/50 |
| 6,998,933 | B1 |   | 2/2006  | Robertson et al. |
| 2002/0098613 | A1 |   | 7/2002  | Loo et al. |
| 2002/0196085 | A1 |   | 12/2002 | Nakamata et al. |
| 2006/0113646 | A1 |   | 6/2006  | Channabasappa et al. |

* cited by examiner

*Primary Examiner*—Wael Fahmy
*Assistant Examiner*—John C Ingham
(74) *Attorney, Agent, or Firm*—Christopher P. Maiorana, PC

(57) ABSTRACT

A series-shunt switch is provided. The switch includes a PIN diode having an input electrical terminal, an output electrical terminal and a thermal terminal. The thermal terminal is configured to provide continuity of diode thermal ground with respect to a circuit thermal ground node.

20 Claims, 5 Drawing Sheets

SERIES-SHUNT SWITCH WITH THERMAL TERMINAL

BACKGROUND OF THE INVENTION

This invention relates generally to switches, and more particularly, to a connection arrangement for series-shunt surface mount radio frequency (RF) and microwave single pole, single throw (SPST) switches having a series PIN diode with a thermal conductor.

SPST solid state switches are commonly used for switching or steering RF power. For high average power (typically 10 watts (W) to 200 W continuous wave) and broadband RF applications (typically 1-1,000 MHz), P-type, Intrinsic, N-type ("PIN") diodes in ceramic metal electrode leadless face ("MELF") packages are often used for SPST switching. These MELF packages are used primarily due to low thermal resistance characteristics in both the die topology (i.e., device design) and the ceramic packaging. However, these MELF packages are not easily designed to include a heat transfer conduit that does not interfere with PIN diode anode (input) and cathode (output) electrical terminals, especially with respect to RF performance. Further, the PIN diode input and output electrical terminals connected to the circuit board typically have the lowest thermal resistance path relative to, for example, the ceramic MELF package body. Therefore, high average power PIN diodes used for SPST switches largely rely on the circuit board as the primary heat transfer conduit. This approach is not only not advantageous for circuit designers, but can affect circuit performance.

Other methods for heat dissipation in these packages are known. For example, use of an RF cover over the PIN diode in combination with a dielectric gasket under the PIN diode is known for dissipating heat. However, such an arrangement adds a capacitive loading effect to the circuit, which is undesirable. It is also known to use thermally conductive material in the gap traces between the anode and cathode of the PIN diode. However, a capacitive loading effect is again added to the circuit.

Thus, these known methods for heat dissipation can cause adverse effects to the overall system operation and affect system design. For example, these known heat dissipating methods can add undesirable capacitive loading as well as cause design constraints.

BRIEF DESCRIPTION OF THE INVENTION

In accordance with an exemplary embodiment, a PIN diode is provided that includes an input electrical terminal, an output electrical terminal and a thermal terminal. The thermal terminal is configured to provide continuity of diode thermal ground with respect to a circuit thermal ground node.

In accordance with another exemplary embodiment, a series-shunt SPST switch connection arrangement is provided. The connection arrangement includes at least one PIN diode embedded in a composite material of silicon semiconductor and glass and wherein an input electrical terminal, an output electrical terminal and a thermal terminal are also provided. The thermal terminal is configured to provide a continuous thermal ground path between a series PIN diode thermal node and a circuit thermal ground node.

In accordance with yet another exemplary embodiment, a method of providing a series-shunt SPST switch is provided. The method includes providing a PIN diode in a substrate of semiconductor material, wherein the PIN diode comprises an input electrical terminal, an output electrical terminal and a thermal terminal. The method further includes configuring the thermal terminal to provide a continuous thermal ground path between a PIN diode thermal node and a circuit thermal ground node.

DETAILED DESCRIPTION OF THE INVENTION

For simplicity and ease of explanation, the invention will be described herein in connection with various embodiments thereof. Those skilled in the art will recognize, however, that the features and advantages of the various embodiments may be implemented in a variety of configurations. It is to be understood, therefore, that the embodiments described herein are presented by way of illustration, not of limitation.

As used herein, an element or step recited in the singular and proceeded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property. Additionally, the arrangement and configuration of the various components described herein may be modified or change, for example, replacing certain components with other components or changing the order or relative positions of the components.

Figure 1:
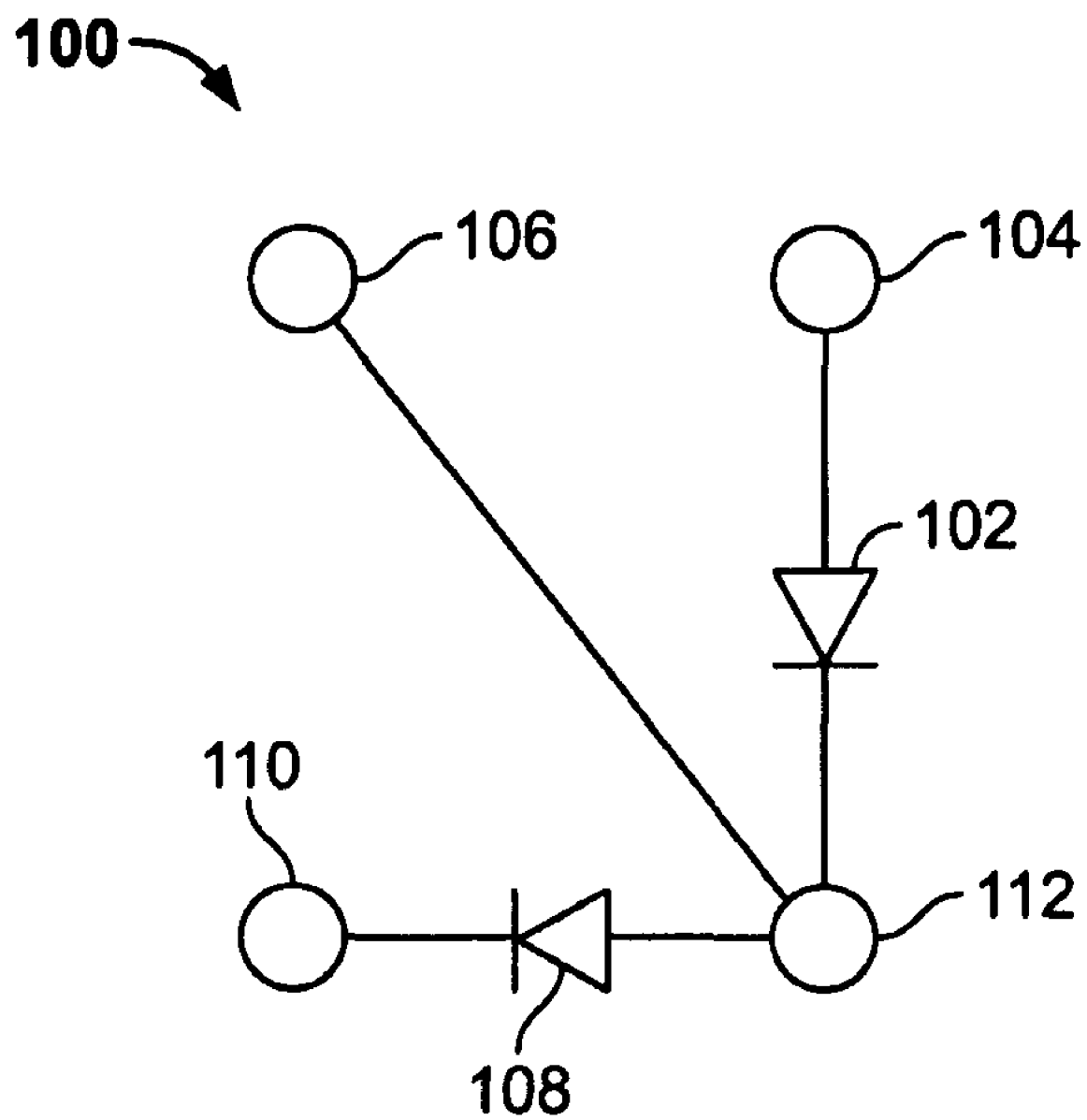
FIG. 1 is a circuit diagram of a series-shunt SPST switch constructed in accordance with various embodiments of the invention.

Various embodiments of the invention provide a switch, such as a single pole, single throw (SPST) switch with a P-type, Intrinsic, N-type ("PIN") diode and having a separate thermal terminal. Referring to FIG. 1, a series-shunt SPST switch 100 constructed in accordance with various embodiments of the invention generally includes a series PIN diode 102 (also referred to herein as the PIN diode 102) connected between an RF input terminal 104 and an RF output terminal 106. An RF line also may be provided to connect at least one of the RF input terminal 104 or the RF output terminal 106 to an RF circuit. A shunt PIN diode 108 is electrically connected between the cathode of the series PIN diode 102 and a radio frequency/direct current (RF/DC) ground terminal 10. Thus, an input electrical terminal (RF input terminal 104), an output electrical terminal (RF output terminal 106) and a RF/DC return terminal (RF/DC ground terminal 110) are thereby provided. A thermal terminal 112 is also provided in combination with the PIN diode 102. In particular, the thermal terminal 112 provides a direct thermal ground path between the PIN diode 102 and a thermal ground node such as, for example, a heat sink or other heat dissipation element as described in more detail herein. Therefore, the thermal terminal 112 is configured to provide continuity of thermal ground between thermal ground of the PIN diode 102 and a thermal ground node of, for example, a circuit, such as a printed circuit board or RF circuit.

In operation, when an RF signal is applied for a low loss switch state, the PIN diode 102 and the shunt diode 108 are driven to opposite states of conduction, namely, the PIN diode 102 is forward biased "ON" and the shunt diode 108 is reverse biased "OFF." Accordingly, an RF signal received at the RF input terminal 104 is directly transmitted with low insertion loss to the RF output terminal 106. In the conjugate RF state of isolation, the PIN diode 102 is reverse biased "OFF" and the shunt diode 108 is forward biased "ON" to produce a high loss state between the RF input 104 and the RF output 106. Because this configuration is a surface mount monolithic microwave integrated circuit (MMIC), all input/output (I/O) ports, namely, the RF input terminal 104, the RF output terminal 106, the ground terminal 110 and the thermal terminal 112 are directly connected (with no associated wire bonds or ribbons) to, for example, an RF microstrip transmission line (not shown) using, for example, a eutectic solder or conductive silver epoxy.

Figure 2:
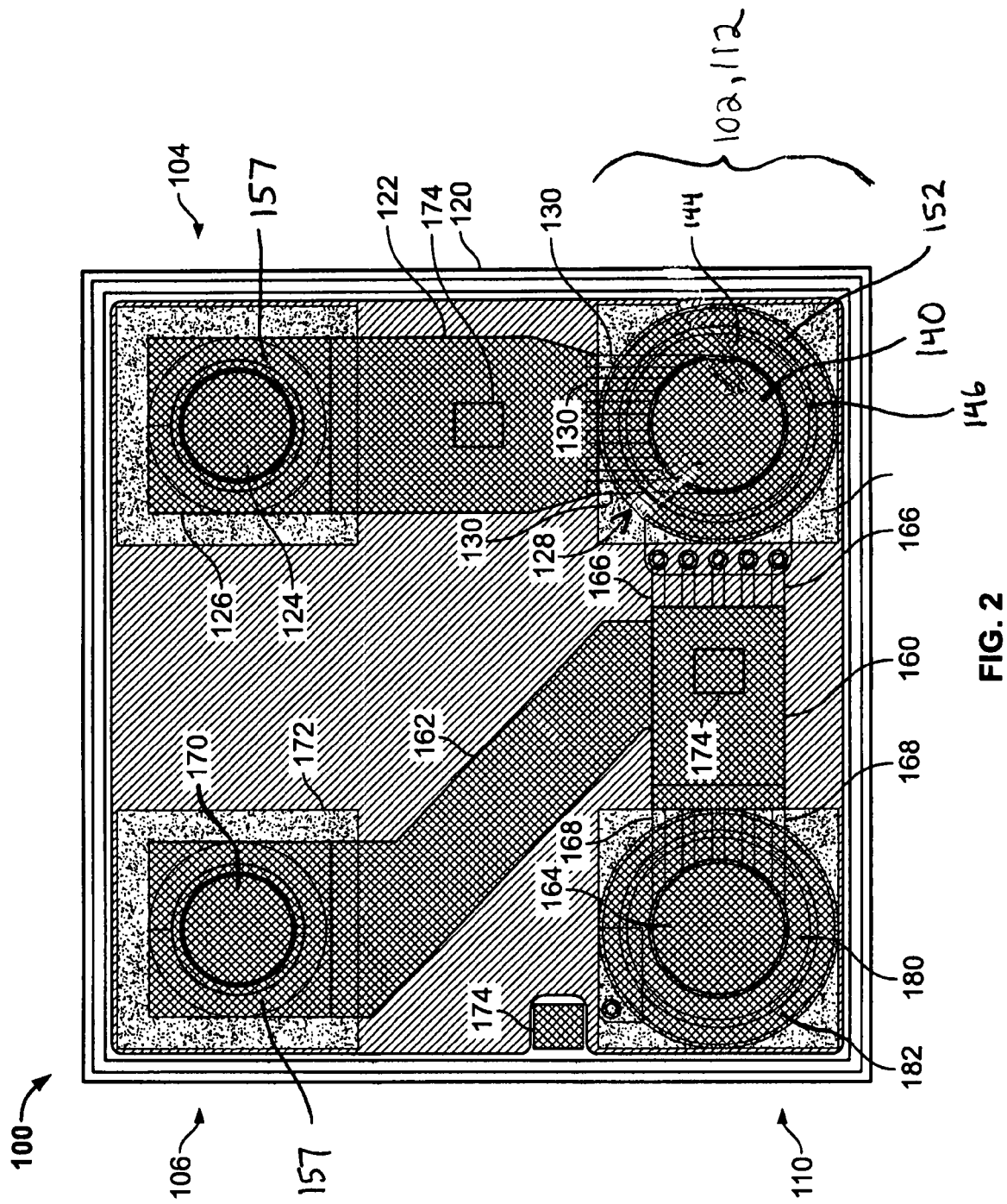
FIG. 2 is a top topological view of a series-shunt SPST switch constructed in accordance with various embodiments of the invention.

FIG. 2 illustrates a topological view of the series-shunt SPST switch 100 shown formed on a die 120. The physical connections of the switch 100 are shown wherein the ohmic contacts of the PIN diode 102 are provided directly on a semiconductor substrate and the thermal terminal 112 is disposed directly over a thermal via 114 (shown in FIG. 3) to provide a continuous thermal path between the PIN diode 102 and a thermal ground node (not shown).

As shown in FIG. 2, the RF input terminal 104 is connected to the thermal terminal 112 via metal traces 122. The RF input terminal 104 includes a silicon via 124 connecting a top surface of the RF input terminal 104 to a bottom surface of the RF input terminal 104, which includes a bonding pad 126 (e.g., a gold layer) for connection to, for example, a circuit board. Thus, the ohmic connection is provided on the underside or backside of the die 120. The metal traces 122 from the RF input terminal 104 are connected to the thermal terminal 112 with a plurality of air bridges 130 (e.g., formed from gold). The plurality of air bridges 130 defines a plurality of electrical connections that reduce parasitic capacitance.

Figure 3:
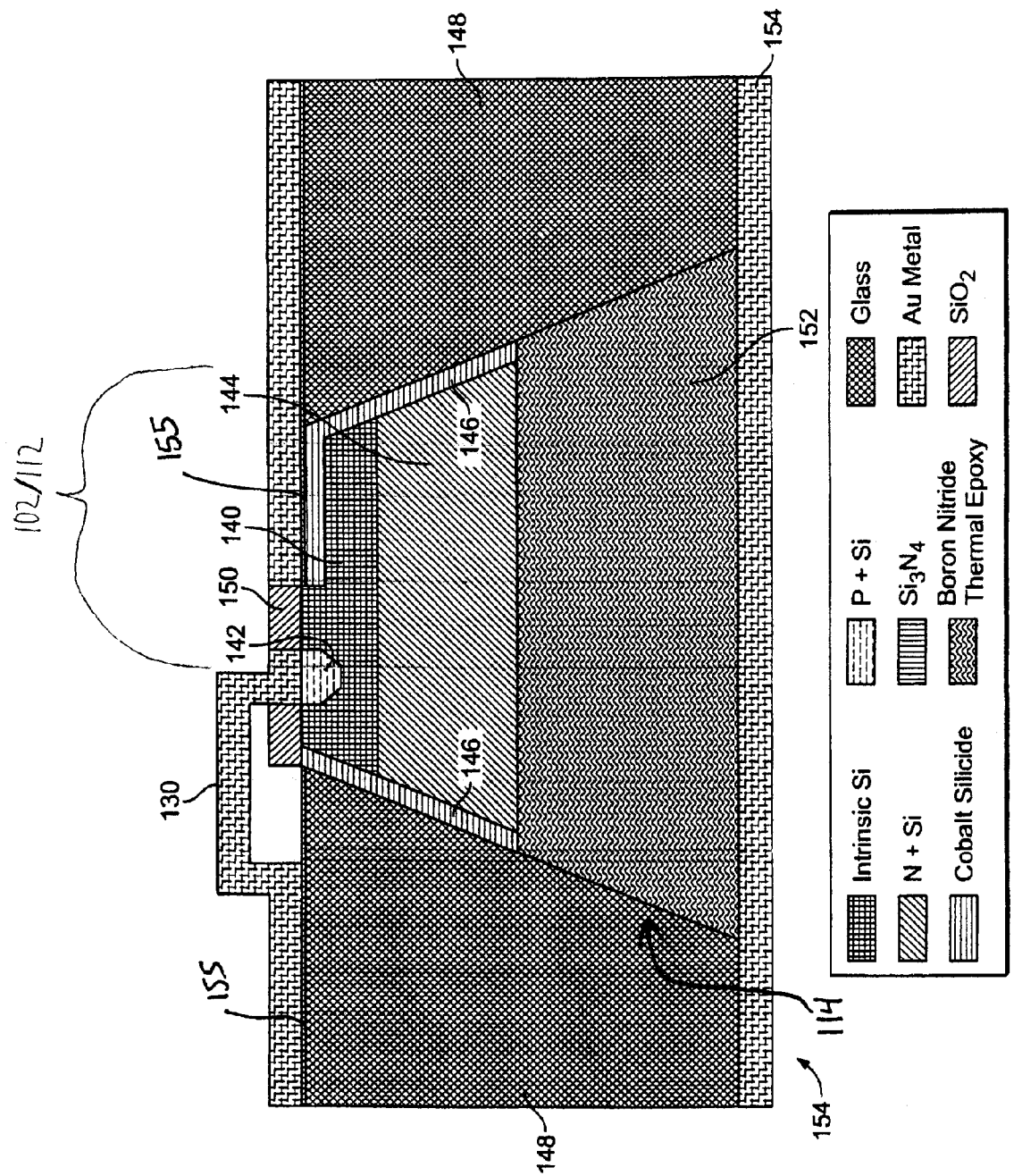
FIG. 3 is a cross-sectional view of a portion of a PIN diode of an SPST switch having a thermal terminal formed in accordance with various embodiments of the invention.

More particularly, and as shown in FIG. 3 the thermal terminal 112 includes a intrinsic silicon layer 140 having implanted therein a P+ silicon node 142 defining a positive anode of the PIN diode 102 and connected to the plurality of air bridges 130 (only one shown). The intrinsic silicon layer 140 is formed on top of an N+ silicon layer 144 defining a negative cathode of the PIN diode. The intrinsic silicon layer 140 and the N+ silicon layer 144 are formed in an inverted frustoconical shape and surrounded on each side and a portion of a top surface by ohmic connection elements 146, which in one embodiment, are formed from cobalt silicide. The intrinsic silicon layer 140 and the N+ silicon layer 144 together with the ohmic connection elements 146 define the PIN diode 102 (shown in FIG. 1). The ohmic connection elements 146 provide an electrical current path therethrough and also separate the pin diode 102 from glass regions 148. A silicon dioxide ($SiO_2$) or silica layer 150 is formed over the intrinsic silicon layer 140 not covered by the ohmic connection elements 146 to protect the active semiconductor region.

A thermal conducting region 152, for example, a thermal epoxy such as boron nitride is provided below the N+ silicon layer 144 and defines a dielectric region or the thermal via 114. The thermal conducting region 152 is formed from any suitable material that is thermally conducting and electrically insulating (e.g., a thermally conducting dielectric material). In one embodiment, the thermal conducting region 152 that defines the thermal via 114 is formed in an area where N+ silicon has been etched away. A thermal node connection 154 (e.g., gold layer) is provided along a bottom surface 154 and that also provides ohmic contact to, for example, a circuit, such as formed on a printed circuit board (not shown). A silicon nitride layer ($Si_3N_4$) 155 also may be provided on top of the structure, for example, on top of a portion of the intrinsic silicon layer 140 having the ohmic connection element 146.

It should be noted that a protective layer (not shown) may be provided over a top surface of the structure shown in FIG. 3. For example, a benzocyclobutene (BCB) based polymer layer (not shown) may be provided, for example, as a nominal layer (e.g., 12 micrometers or microns) to hermetically encapsulate the structure. It also should be noted that not all of the layers or metallizations shown in the structure of FIG. 3 are necessarily shown in the structure of FIG. 2. The structure shown in FIG. 3 may have a total thickness from a top surface to a bottom surface of about 125 microns.

Thus, the PIN diode 102 is provided in combination with the thermal via 114 to form the thermal terminal 112. The thermal via 114 is formed from a thermally conducting and electrically insulating material and together with the thermal terminal 112 is formed using conventional heterolithic microwave integrated circuit (HMIC) process fabrication methods. Other portions of the various embodiments also may be formed using an HMIC process. The material used for the thermal via 114, for example, boron nitride, is selected such that the thermal terminal 112 can be configured to provide sufficient RF isolation with respect to the RF/DC ground terminal 110 to maintain a suitable low insertion loss. Those skilled in the art will recognize, however, that other thermally conducting, electrically insulating materials also may be used for achieving RF isolation and low insertion loss through the construction of the thermal terminal 112.

Referring again to FIG. 2, the thermal terminal 112 is also connected to the RF/DC ground terminal 110 via metal traces 160 and to the RF output terminal 106 via metal traces 162. The RF/DC ground terminal 110 includes a silicon via 164 connecting a top surface of the RF/DC ground terminal 110 to a bottom surface of the RF/DC terminal 110. A plurality of air bridges 166 connect the thermal terminal 112 to the metal traces 160 and a plurality of air bridges 168 connect the metal traces 160 to the RF/DC ground terminal 110. The plurality of air bridges 166 and 168 define a plurality of electrical connections that reduce parasitic capacitance.

The RF output terminal 106 similar to the RF input terminal 104 includes a silicon via 170 connecting a top surface of the RF output terminal 106 to a bottom surface of the RF output terminal 106, which includes a bonding pad 172 (e.g., a gold layer) for connection to, for example, a circuit board. Thus, the ohmic connection is again provided on the underside or backside of the die 120. It should be noted that metallized rings 157 are also provided on the RF input terminal 104 and RF output terminal 106.

One or more probe points 174 may be provided that allow testing, for example, DC testing. The probe points 174 may be metal connection test points that are accessible from openings etched in the top side coating of the die 120.

In operation, electrical flow starts at the ohmic connection of the RF input 104, namely the bonding pad 126 of the RF input 104 and continues upward through the silicon via 124. Electrical flow then continues from the RF input 104 to the thermal terminal 112 via the metal traces 122 along a top surface of the die 120. Electrical flow then continues through the plurality of air bridges 130 into an anode 142 (shown in FIG. 3) of the PIN diode 102 at the thermal terminal 112 and down through a silicon via 128 defined by the intrinsic silicon layer 140 and the N+ silicon layer 144 (defining the cathode of the PIN diode 102) and stopping at the thermal conducting region 152 (shown in FIG. 3). Specifically, electrical flow continues down the silicon via 128 about two to three millimeters and then stops at the thermal conducting region 152, which is also electrically insulating. Electrical flow is then blocked, but thermal flow/conduction continues downward through the thermal conducting region 152 or thermal via 114.

Electrical flow then proceeds back up through the ohmic connection elements 146 (shown in FIG. 3) and out of the PIN diode 102 at the thermal terminal 112. Electrical flow continues through the plurality of air bridges 166 and then the metal traces 160 through the plurality of air bridges 168 to the RF/DC ground terminal 110. At the RF/DC ground terminal 110 electrical flow continues into an anode 180 at the RF/DC ground terminal 110 down the silicon via 164 (e.g., to a circuit board connected to a bottom surface of the die 120) and then back up through a cathode 182 at the RF/DC ground terminal 110. The anode 180 and cathode 182 define the shunt PIN diode 108. Electrical flow continues back into the metal traces 160 through the plurality of air bridges 168 and then to the RF output terminal 106 via the metal traces 162 (connected to the metal traces 160), again along the top of the die 120. Electrical flow then continues down the silicon via 170 of the RF output terminal 106 and ends at the ohmic contact, namely the bonding pad 172, of the output terminal 106 on a bottom surface of the die 120 that is connected for example, to a circuit board.

It should be noted that in order to provide the PIN diode 102 with ohmic contacts (e.g., input, output and thermal terminals) that are directly solderable to a semiconductor substrate, the PIN diode 102 in various embodiments is "packageless", meaning that the PIN diode 102 is not constructed with an outer packaging. In the packageless design, "parasitics" (e.g., unintended cross talk, resistance, ground bounce, etc.) are reduced relative to typical PIN diode packaging, such as ceramic metal electrode leadless face (MELF) or plastic. Further, as described above, the "surface mountable" ohmic contacts are configured on a mountable surface that abuts the semiconductor substrate, thus eliminating the need for wire bonding or other electrical bonding elements that may increase parasitics and reduce the circuit performance range. As such, the reduced parasitics associated with a packageless PIN diode allow for a higher frequency of operation beyond the 1 GHz effective limit that is typical of ceramic MELF packaged diodes. Thus, the packageless design is effective for higher frequency response and RF power handling applications.

In at least one embodiment, the thermally conductive dielectric region of the thermal terminal 112 is below the silicon via 114 (defining the thermal via 114) and, thus, is configured to be disposed in the substrate of semiconductor material (e.g., the die 120). For example, the series-shunt SPST switch 100 may be located on the topside plane of the substrate while the heat sink may be located on the backside plane of the substrate. The thermally conductive dielectric region may in turn be configured to connect the thermal terminal 112, configured to be mountable to the topside plane of the substrate, to the backside plane heat sink. In the various embodiments, the PIN diode 102 includes each of the RF input and output terminals 104 and 106, respectively, and the thermal terminal 112 on a surface that is directly mountable to a substrate of semiconductor material. As such, the thermally conductive dielectric region may be configured to be disposed within the semiconductor material with the thermal terminal 112 disposed directly over the thermally conductive dielectric region relative to the substrate. Therefore, wire bonding, thermal grease, dielectric gaskets and other typical thermal connection elements are not necessary to mount the thermal terminal 112 to the substrate or for the thermal terminal 112 to provide continuity of ground to a thermal ground node. This configuration, thus, allows a direct solderable low-ohmic contact to the thermal ground (e.g., as positioned by a circuit designed) for thermal conductivity along the thermal ground path between the PIN diode 102 and the thermal ground node, which is also positioned by, for example, a circuit designer.

Figure 4:
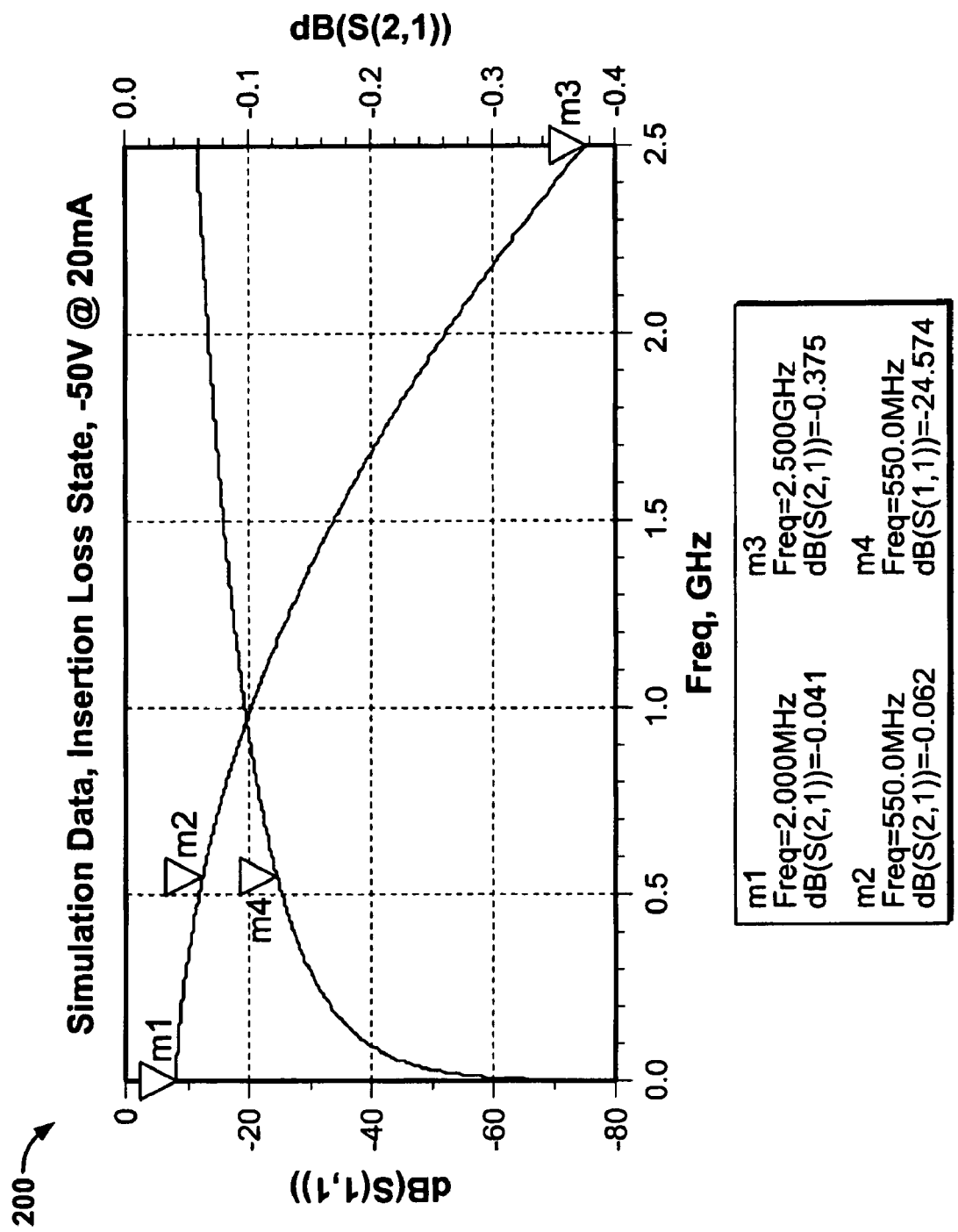
FIG. 4 a graphical representation of expected loss/voltage standing wave ratio ("VSWR") performance for a series-shunt SPST switch with a thermal terminal constructed in accordance with various embodiments of the invention.

In operation, the PIN diode 102 having the thermal terminal 112 as described herein may be usable and scalable for microwave frequencies. For example, the various embodiments allow operation (e.g., switching) from about 30 MHz to about 2.5 GHz, thereby allowing operation in applications, such as, but not limited to, high power military radios. The operating characteristics of the series-shunt SPST switch 100 with a thermal terminal constructed in accordance with various embodiments and when utilizing a TTL PIN diode driver with +5V and −12V power supplies at 10 kHz repetition rate, provides in some embodiment an expected insertion loss at the thermal terminal 112 of 0.1 dB at 1 GHz for −20 mA at −10 V bias conditions. At 2.5 GHz, the insertion loss is estimated at 0.35 dB (−20 mA at −10 V bias conditions). The expected insertion loss over the entire frequency range from 2 MHz to 2.5 GHz is illustrated in the graphical chart representation 200 shown in FIG. 4.

Figure 5:
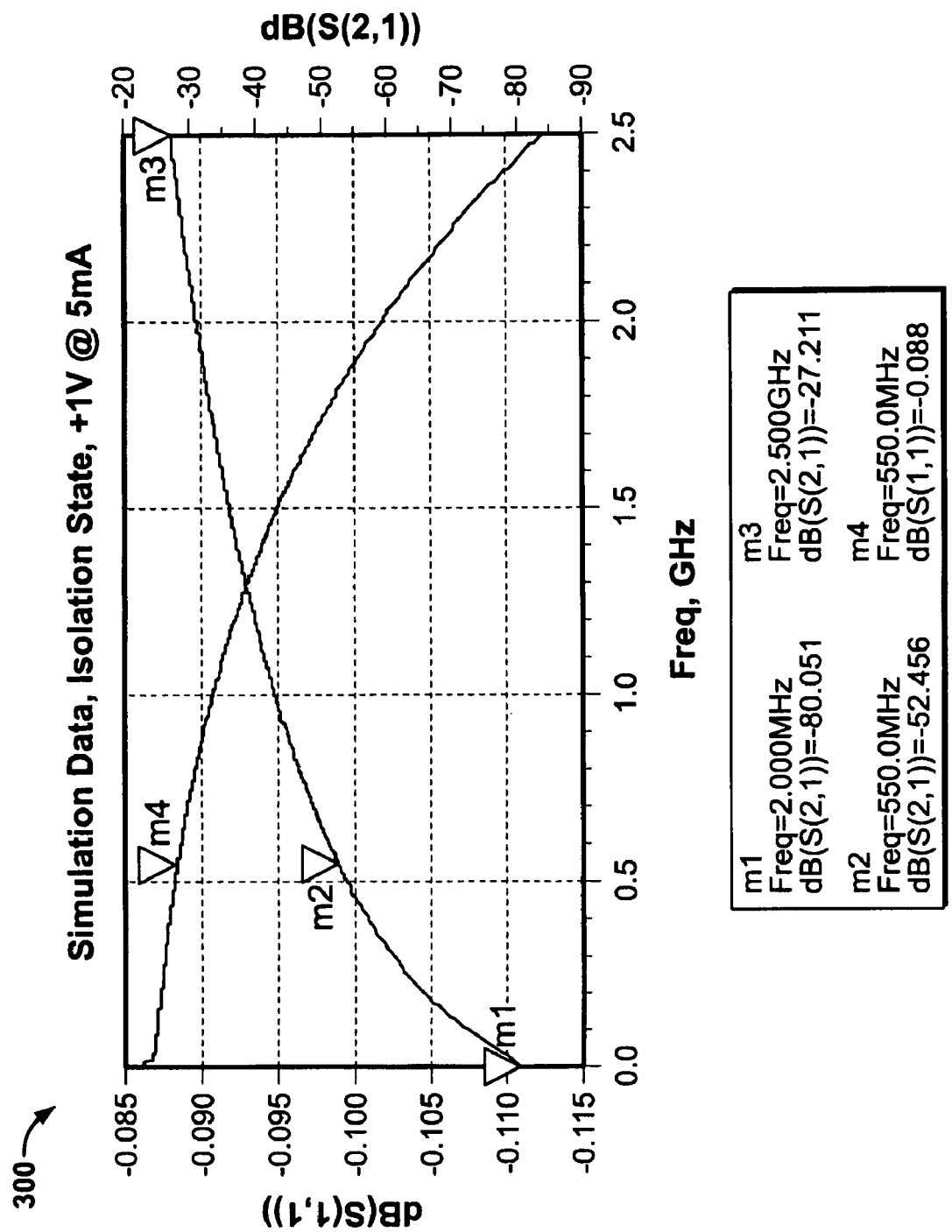
FIG. 5 is a graphical representation of expected RF isolation performance for a series-shunt SPST switch with a thermal terminal constructed in accordance with various embodiments of the invention.

The operating characteristics of the series-shunt SPST switch 100 with a thermal terminal constructed in accordance with various embodiments also includes an expected RF isolation performance for the thermal terminal 112 with respect to the RF/DC ground. For example, at 1 GHz, RF isolation is estimated to be 45 dB for +1 V at +10 mA bias conditions. At 2.5 GHz, RF isolation at the thermal terminal 112 is estimated to be 27 dB at 2.5 GHz (+1 V at +10 mA bias conditions). The RF isolation performance over the entire frequency range from 2 MHz to 2.5 GHz is illustrated in the graphical chart representation 300 shown in FIG. 5.

Thus, various embodiments of the invention provide a thermal terminal on a mountable surface of a PIN diode that may include a series-shunt SPST switch to provide a direct, solderable, low-ohmic contact to a thermal ground node, such as a circuit board heat sink. The configuration and topology of the various embodiments results in improved thermal conductivity of the power dissipating series diode to ambient thermal ground. The thermal terminal also provides improved RF isolation from RF/DC ground to maintain a low insertion loss with respect to alternative thermal contacts such as thermal grease and dielectric gaskets, while still securing the diode package to a circuit thermal ground. Additionally, the relatively low parasitics of the various embodiments with respect to ceramic MELF or plastic packages allow for a frequency of operation that may extend beyond 1 GHz at 45 W average power. As such, the various embodiments improve RF power handling and higher frequency response performance requirements for series-shunt SPST switches useful for different RF power applications.

It should be noted that modifications and variations to the various embodiments are contemplated. For example, the positioning and size of the terminals and nodes may be modified based on the particular application, use, etc. The modification may be based on, for example, different desired or required operating characteristics.

Accordingly, it is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description.

The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A PIN diode comprising:
   an input electrical terminal;
   an output electrical terminal; and
   a thermal terminal, the thermal terminal configured to be (i) in electrical and RF conductive contact with said input electrical terminal and said output electrical terminal and (ii) in thermal conductive contact with a circuit thermal ground node, wherein said circuit thermal ground node is electrically and RF insulated from said input electrical terminal, said output electrical terminal and said thermal terminal.

2. A PIN diode in accordance with claim 1, further comprising a surface configured to be embedded into a substrate of semiconductor material, the surface comprising the input electrical terminal, the output electrical terminal and the thermal terminal.

3. A PIN diode in accordance with claim 1, further comprising an RF/DC ground terminal, wherein the thermal terminal is configured to provide RF isolation with respect to the RF/DC ground terminal.

4. A PIN diode in accordance with claim 1, wherein the PIN diode is configured for operation in connection with a series-shunt SPST switch.

5. A PIN diode in accordance with claim 1, wherein the thermal ground node comprises a heat sink.

6. A PIN diode in accordance with claim 1, wherein the thermal terminal comprises a thermally conductive dielectric region formed from boron nitride.

7. A series-shunt SPST switch connection arrangement, the connection arrangement comprising at least one PIN diode configured to be embedded into a composite material of silicon semiconductor and glass, and including an input electrical terminal, an output electrical terminal and a thermal terminal, with the thermal terminal configured to be (i) in electrical and RF conductive contact with said input electrical terminal and said output electrical terminal, (ii) in thermal conductive contact with a circuit thermal ground node, wherein said circuit thermal ground node is electrically and RF insulated from said input electrical terminal, said output electrical terminal and said thermal terminal, and (iii) provide a continuous thermal ground path between a PIN diode thermal node and said circuit thermal ground node.

8. A connection arrangement in accordance with claim 7, further comprising an RF/DC ground terminal, wherein the thermal terminal is configured to provide RF isolation between the thermal ground path and the RF/DC ground terminal.

9. A connection arrangement in accordance with claim 7, wherein the thermal terminal is connected to a thermal via configured to be disposed in the substrate of semiconductor material.

10. A connection arrangement in accordance with claim 9, wherein the PIN diode is configured to be disposed over the thermal via relative to a plane of the substrate of semiconductor material.

11. A connection arrangement in accordance with claim 9, wherein the thermal via is solid filled and comprises a thermally conductive dielectric material.

12. A connection arrangement in accordance with claim 7, further comprising an RF line to connect at least one of the input and output terminals to an RF circuit.

13. A connection arrangement in accordance with claim 7, wherein the thermal ground node comprises a heat sink.

14. A connection arrangement in accordance with claim 7, further comprising a plurality of PIN diodes including a series PIN diode and a shunt PIN diode.

15. A method of providing a series-shunt SPST switch, the method comprising:
   providing a PIN diode in a substrate of semiconductor material, the PIN diode comprising an input electrical terminal, an output electrical terminal and a thermal terminal; and
   configuring the thermal terminal to be (i) in electrical and RF conductive contact with said input electrical terminal and said output electrical terminal, (ii) in thermal conductive contact with a circuit thermal ground node, wherein said circuit thermal ground node is electrically and RF insulated from said input electrical terminal, said output electrical terminal and said thermal terminal, and (iii) provide a continuous thermal ground path between a PIN diode thermal node and said circuit thermal ground node.

16. A method in accordance with claim 15, further comprising providing an RF/DC ground terminal, wherein the thermal terminal is configured to provide RF isolation between the thermal ground path and the RF/DC ground terminal.

17. A method in accordance with claim 15, further comprising providing a thermal via configured to be disposed in the substrate of the semiconductor material, wherein the thermal terminal is connected to the thermal via and the thermal via is about two millimeter to three millimeters below a top surface of the substrate.

18. A method in accordance with claim 17, wherein the PIN diode is configured to be disposed over the thermal via relative to the plane of the substrate of semiconductor material.

19. A method in accordance with claim 17, wherein the thermal via is a region in an area etched from the semiconductor material and includes a solid filled thermal material.

20. A method in accordance with claim 15, wherein the thermal ground node comprises a heat sink.

* * * * *